United States Patent [19]

McClanahan et al.

[11] Patent Number: 5,396,397
[45] Date of Patent: Mar. 7, 1995

[54] FIELD CONTROL AND STABILITY ENHANCEMENT IN MULTI-LAYER, 3-DIMENSIONAL STRUCTURES

[75] Inventors: Robert F. McClanahan, Valencia; Robert D. Washburn, Malibu, both of Calif.

[73] Assignee: Hughes Aircraft Company, Los Angeles, Calif.

[21] Appl. No.: 951,504

[22] Filed: Sep. 24, 1992

[51] Int. Cl.$^6$ .............................................. H01G 4/20
[52] U.S. Cl. ...................... 361/313; 361/321.2; 361/762; 361/795
[58] Field of Search ............... 361/311, 312, 313, 320, 361/321, 746, 762, 795; 174/255, 250, 258; 257/691, 700

[56] References Cited

U.S. PATENT DOCUMENTS

| | | | |
|---|---|---|---|
| 4,328,531 | 5/1982 | Nagashima et al. | 174/262 |
| 4,567,542 | 1/1986 | Shimada et al. | 361/321 |
| 4,607,314 | 8/1986 | Wada et al. | 361/321.4 |
| 4,800,459 | 1/1989 | Takagi et al. | 361/321 |
| 4,882,650 | 11/1989 | Maher et al. | 361/321 |
| 5,055,966 | 10/1991 | Smith et al. | 361/321 |
| 5,089,881 | 2/1992 | Panicker | 257/691 |
| 5,099,388 | 3/1992 | Ogawa et al. | 361/321 |
| 5,144,526 | 9/1992 | Vu et al. | 361/321 |
| 5,185,690 | 2/1993 | Miller | 361/321 |

Primary Examiner—Bruce A. Reynolds
Assistant Examiner—Gregory L. Mills
Attorney, Agent, or Firm—L. A. Alkov; W. K. Denson-Low

[57] ABSTRACT

Unitized multilayer circuit structures including basic substrate insulating layers and dielectric field control layers having dielectric constants different from the dielectric constant of the basic substrate insulating layers.

4 Claims, 5 Drawing Sheets

FIELD CONTROL AND STABILITY ENHANCEMENT IN MULTI-LAYER, 3-DIMENSIONAL STRUCTURES

BACKGROUND OF THE INVENTION

The disclosed invention is directed generally to hybrid multilayer circuit structures, and is directed more particularly to hybrid multilayer circuit structures having integral electromagnetic interference (EMI) shielding dielectric layers formed therein.

Hybrid multilayer circuit structures, also known as hybrid microcircuits, implement the interconnection and packaging of discrete circuit devices, and generally include a unitized multilayer circuit structure formed from a plurality of integrally fused insulating layers (e.g., ceramic layers) having conductor traces disposed therebetween. The discrete circuit devices (e.g., integrated circuits) are commonly mounted on the top insulating layer so as not to be covered by another insulating layer or on an insulating layer having die cutouts formed thereon to provide cavities for the discrete devices. Passive components such as capacitors and resistors can be formed on the same layer that supports the discrete devices, for example, by thick film processes, or they can be formed between the insulating layers, for example, also by thick film processes. Electrical interconnection of the conductors and components on the different layers is achieved with vias or holes appropriately located and formed in the insulating layers and filled with conductive via fill material, whereby the conductive material is in contact with predetermined conductive traces between the layers that extend over or under the vias.

A consideration with hybrid multilayer circuit structures is shielding and controlling electric fields which are generated internally to the hybrid multilayer circuit structure (for example by RF microstrip or stripline conductors), as well as for externally generated electric fields.

Known techniques for controlling electric fields in hybrid multilayer circuit structures include circuit conductor separation, conductive shielding and/or packaging external to the multilayer circuit structure, and internal conductive ground planes. External shielding adds significant cost in typical applications. Moreover, the required isolation is not always readily achieved with conductive shields wherein ground/shield current flow can induce additional coupling. The problem becomes more difficult with RF power circuits.

A major consideration with conductive shielding is that both the field and induced conductor currents must be considered in controlling internal and external interference and feedback. Any non-orthogonal interaction between a field and a conductor will result in an induced current in the conductor. The induced current will vary at the same frequency as the field, and at RF frequencies the resulting signal is not easily localized and can be easily coupled into circuitry that is sufficiently near the conductor. Where the conductor is a ground, power, or shield plane, the induced signal can be coupled through parasitic elements into virtually any part of the circuitry. This is typically controlled by a combination of providing short, low impedance return paths, separate localized shielding, "point grounds", and modified circuit layouts. The major difficulty is that RF ground currents are not easily predicted or measured, which means that the particular means for controlling induced currents must be determined empirically.

SUMMARY OF THE INVENTION

It would therefore be an advantage to provide integral electric field shielding structures for multilayer circuit structures.

The foregoing and other advantages are provided by the invention in incorporating dielectric field control layers into the layers of unitized multilayer circuit structures wherein the dielectric constant of the dielectric field control layers are different from the dielectric constant of the basic substrate insulating layers.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
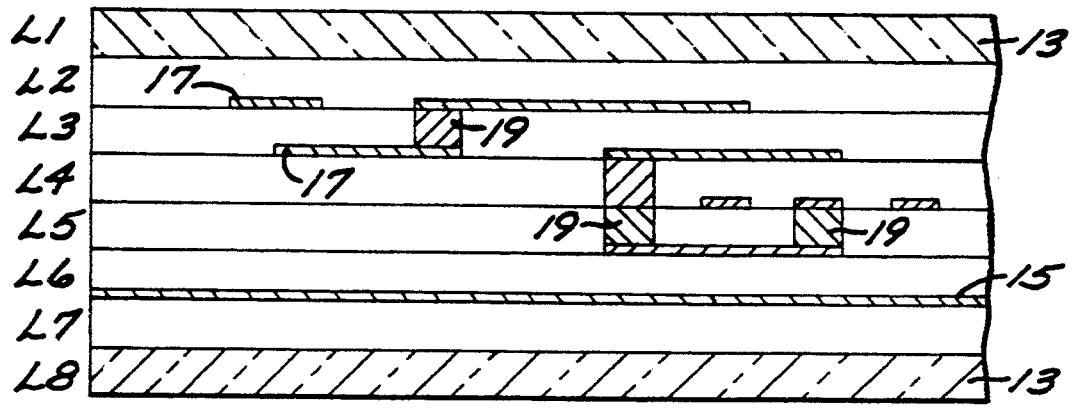
FIG. 1 is a schematic elevational sectional view of a unitized multilayer circuit structure in accordance with the invention that includes top and bottom high dielectric constant field layers.

In the following detailed description and in the several figures of the drawing, like elements are identified with like reference numerals.

Dielectric field control layers in accordance with the invention are implemented in a unitized multilayer circuit structure that is utilized for interconnecting various discrete circuits mounted on the outside thereof. The unitized multilayer circuit structure is formed from a plurality of insulating layers (comprising ceramic, for example), conductive traces disposed between the insulating layers, and conductive vias formed in the layers which together with any buried elements (e.g., elements formed on the top of an insulating layer and covered by an overlying insulating layer) are processed to form an integrally fused unitized multilayer structure. The discrete circuits are typically mounted and electrically connected on the outside of the unitized multilayer circuit structure after the unitizing fabrication.

In accordance with the invention, dielectric field control layers having dielectric constants higher or lower than the dielectric constant of the insulating layers are incorporated into the multilayer circuit structure. Also, multiple layers of intermixed high and low dielectric constant layers can be utilized to increase isolation effects. By way of illustrative example, the basic insulating layers of the multilayer circuit structure can comprise Dupont 851-AT substrate material having a processed and fired dielectric constant of about 7 or 8, and the field control high dielectric constant layers in accordance with the invention can comprise Electro Science Laboratory ESL-D121-CT substrate material having a processed and fired dielectric constant of about 100.

As used herein, "high dielectric constant field control layers" or "high dielectric field layers" refer to dielectric layers having a dielectric constant that is higher than the dielectric constant of the basic insulating layers of the circuit structure containing the dielectric layers; and "low dielectric constant field control layers" or "low dielectric field control layers" refer to dielectric layers having a dielectric constant that is lower than the dielectric constant of the basic insulating layers of the circuit structure containing the dielectric layers.

By way of illustrative example, for a ceramic unitized multilayer structure, the dielectric field control layers in accordance with the invention comprise dielectric tape layers formed integrally with the basic insulating layers of the structure, such as with low and high temperature cofired ceramic processes.

High dielectric field control layers in accordance with the invention control electric fields within the unitized multilayer circuit structure, minimize EMI, and minimize circuit/environmental interactions and parasitics. The high dielectric field control layers can be implemented with processes for making unitized multilayer circuit structures, and provide a second dielectric medium which can be used to the present the components of the multilayer circuit structure (insulating layers and conductors) with a relative uniform background so that the parasitic can be better defined and accommodated in the design process. The field control layers decrease the sensitivity of the multilayer circuit structure to the environment external thereto, and can be used in conjunction with known EMI control techniques.

The choice of location and material for dielectric field control layers in accordance with the invention is highly dependent on the characteristics of the particular application including, for example, circuit geometry, operating frequencies, power level, and so forth. Although any number of different dielectric layer materials can be used in a particular application, cost considerations may typically restrict the number to a maximum of two.

The dielectric field control layers are very useful in circuitry utilizing VHF frequencies and above. However, there can be benefits for low frequency applications wherein the dielectric field control layers would provide a capacitive divider effect between conductors within the substrate and the external environment. The dielectric field control layers in such applications will typically have a dielectric constant lower than the dielectric constant of the basic substrate insulating layers so as to reduce the effective DC capacitance between the conductors within the substrate and the external environment.

For high frequency (including microwave and millimeter wave) applications, the determination of appropriate field control layer patterns and materials is more complex since transmission line and distributed effects must be taken into account. In these cases, the isolation (or coupling) effects result primarily from the impedance differentials presented to the circuits by the different dielectric materials. Dielectric field control layers with a dielectric constant higher than the dielectric constant of the basic substrate insulating layers will be used most frequently, although the presence of high dielectric layers increases the total DC capacitance between conductors and between the substrate circuitry and the external environment. Field control layers as well as other isolating structures (including conductive ground planes) are best determined by constructing a three dimensional model of the particular substrate and calculating the fields present. The isolating structures can then be added, and their properties, sizes and positions altered through an iterative optimization process to achieve the desired field and circuit isolation for the specific application. Software that can accomplish this function and run on most CAD workstations (such as the SUN Spark II) include the "High Frequency Structure Simulator" by Hewlett Packard and "Maxwell" by ANSOFT.

Referring now to FIG. 1, schematically depicted therein is a multilayer circuit structure that includes a plurality of layers L1 through L8 wherein the top layer L1 and the bottom layer L8 comprise high dielectric constant field control layers 13, and the intervening layers L2 through L7 comprise basic substrate insulating layers. For ease of identifying the field control layers depicted in the figures of the drawing, the basic substrate insulating layers are not shaded while the field control layers are shaded. A ground plane 15 comprising a thick film conductive layer, for example, is disposed between the bottom basic insulating layer L7 and the overlying insulating layer L6. Formed between the insulating layers of the multilayer circuit structure are electrical circuit patterns including, for example, metallizations 17 between the layers and via fills 19 schematically shown in FIG. 1. The metallizations, via fills, and other components of the electrical circuit patterns can form electrical components such as resistors, capacitors, and inductors which are compatible with the process utilized to fabricate the unitized multilayer circuit structure.

While not specifically shown in FIG. 1, it should be appreciated that conductive shields, particularly localized ones, can be utilized in addition to the dielectric shielding of the invention. It should also be appreciated that the ground plane could be disposed on the bottom of the high dielectric constant layer 13. These configurations are shown in FIG. 2, discussed immediately below.

Figure 2:
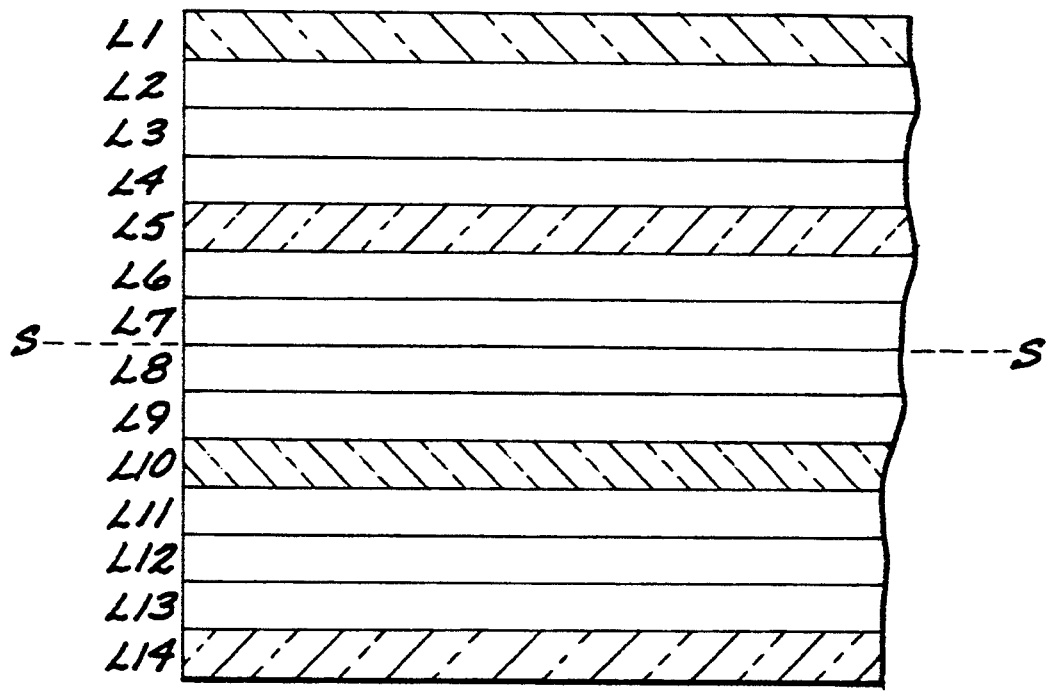
FIG. 2 is a schematic elevational sectional view of a unitized multilayer circuit structure in accordance with the invention that includes top and bottom high dielectric constant field layers as well as embedded high dielectric field control layers.

Referring now to FIG. 2, schematically depicted therein is a unitized multilayer circuit structure in accordance with the invention that includes layers L1 through L14 wherein the layers L1, L14 comprise high dielectric constant field control layers on the top and bottom of the structure, the layers L5, L10 comprise high dielectric constant field control layers embedded in the structure and thus internal thereto, and the remaining layers comprise basic insulating layers. For reasons discussed in detail further herein, the high dielectric constant layers L1, L5, L10, L14 are arranged in pairs that are symmetrical about the vertical plane of symmetry S of the multilayer circuit structure.

High dielectric constant field control layers in accordance with the invention can include cavity openings or via openings in the same manner as the basic insulating layers included in the multilayer circuit structure, wherein the cavity openings form sections of cavities in which discrete components can be placed pursuant to conventional designs, and wherein the via openings are filled with via fill material. It should be appreciated that openings in a high dielectric constant layer will result in some reduction in the effectiveness of the high dielectric constant layer. The high dielectric constant field control layers in accordance with the invention can also be printed with passive components, conductive traces, and conductive shields in the same manner as the basic insulating layers included in the multilayer circuit structure.

Figure 3:
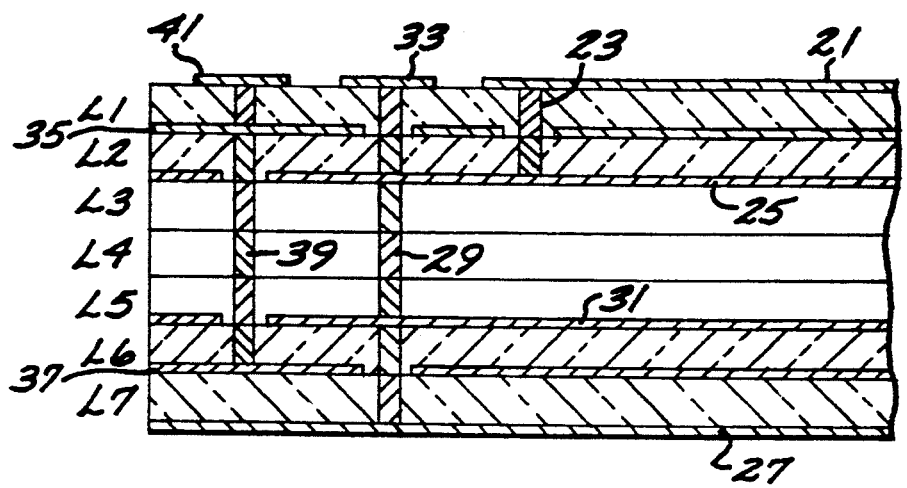
FIG. 3 is a schematic elevational sectional view of a further unitized multilayer circuit structure in accordance with the invention that illustrates the use of a dielectric field control layer as the dielectric material for capacitors integral to the structure.

Referring now to FIG. 3, schematically depicted therein is a multilayer circuit structure that includes a plurality of layers L1 through L7 wherein the top two layers L1, L2 and the bottom two layers L6, L7 comprise high dielectric constant field control layers, and the intervening layers L3 through L5 comprise basic substrate insulating layers. The structure of FIG. 3 illustrates the use of field control layers for implementation of capacitors integral to the multilayer circuit structure. A top external ground plane 21 is conductively connected by conductive vias 23 to an embedded ground plane 25 formed on the layer L2, and a bottom external ground plane 27 is conductively connected by conductive vias 29 to an embedded ground plane 31 formed on the layer L5 and to the embedded ground plane 25. The conductive vias 29 extend through the dielectric layers L2, L1 to a DC return pad 33 formed on the dielectric layer L1. An embedded DC input voltage plane 35 formed on the dielectric layer L2 and a further embedded DC input voltage plane 37 formed on the dielectric layer 17 are conductively interconnected by conductive vias 39 which extend through the dielectric layer L2, L1 to a DC input pad 41 disposed on the dielectric layer L1. The integrated capacitors are parallel capacitors formed by the DC input voltage plane 35 and the ground planes 21, 25, and parallel capacitors formed by the DC input voltage plane 37 and the ground planes 27, 31. By utilizing the a high dielectric field control layer as the dielectric material for an integral capacitor, the capacitor is can be considerably smaller that it would be otherwise for the same capacitance value. However, it should be appreciated that the functions of field control and isolation provided by the field control layer may require some sacrifice in total capacitance, since localized removal of portions of the capacitor plate conductive areas may be required.

Figure 4:
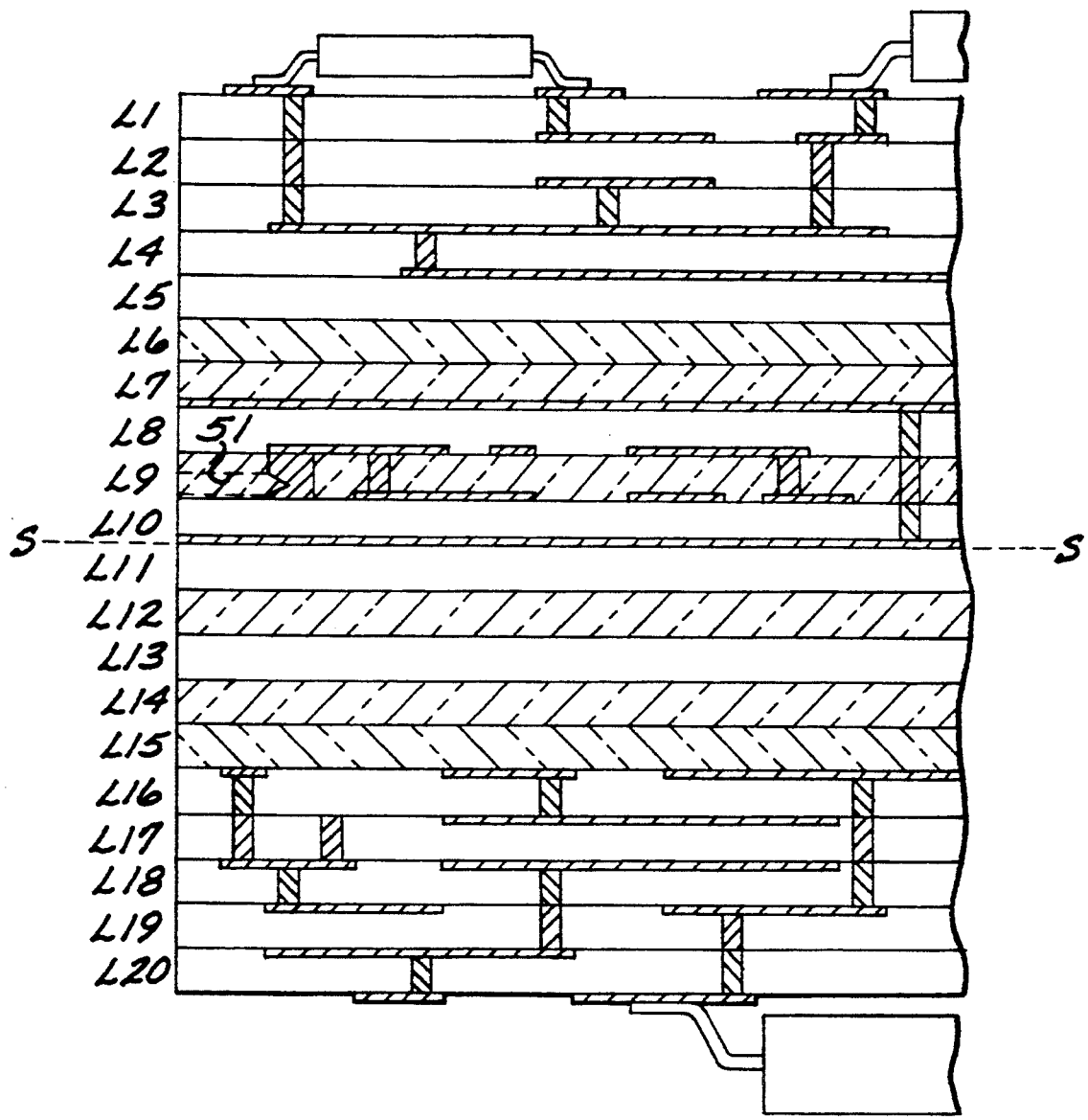
FIG. 4 is a schematic elevational sectional view of a unitized multilayer circuit structure in accordance with the invention that illustrates isolation of a plurality of circuits by field control layers and further illustrates the use of a dielectric field control layer as the dielectric material for capacitors integral to the structure.

Referring now to FIG. 4, schematically illustrated therein is a multilayer circuit structure that includes substrate layers L1 through L20. By way of illustrative example, three separate circuits that need to be isolated from each other are respectively disposed on layers L1 through L6, layers L8 through L12, and layers L16 through L20. Layers L12, L14, L15 are dielectric field control layers that, for example, have been determined to provide the appropriate isolation between the bottom circuit and the middle circuit. As a result of the requirement that dielectric field control layers be symmetrically distributed about the vertical symmetry axis S of the multilayer circuit structure, the layers L6, L7, and L9 must be dielectric field control layers. For the example that the layers L6, L7 provide the appropriate isolation between the middle circuit and the top circuit, the dielectric field control layer L9 is in the portion of the circuit structure that contains the middle circuit, and can be advantageously utilized as the dielectric for integral capacitors whose plates would be on the layers L9 and L10. As discussed previously as to FIG. 3, such integral capacitors would be considerably smaller than they otherwise would be for the same capacitance values. An externally accessible embedded contact 51 in the dielectric field control layer L 9 is shown to further illustrate that field control layers in accordance with the invention can include contacts in the same manner as the basic insulating layers of the circuit structure.

Figure 5:
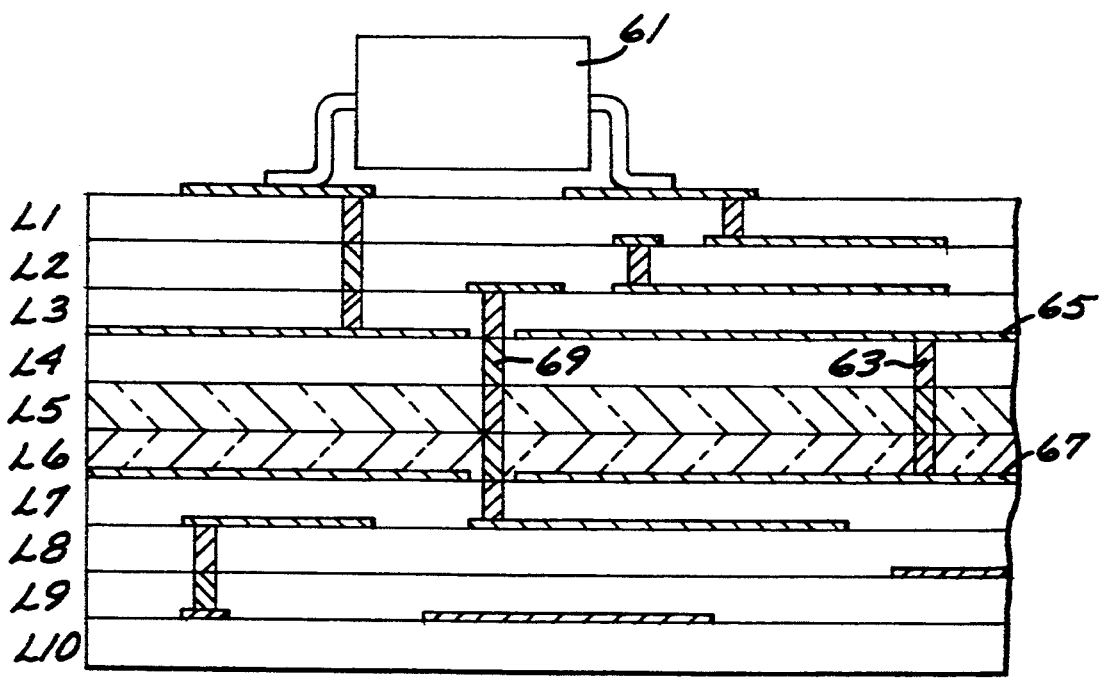
FIG. 5 is a schematic elevational sectional view of a unitized multilayer circuit structure in accordance with the invention that illustrates isolation of a noisy circuit by field control layers.

Referring now to FIG. 5, schematically illustrated therein is a multilayer circuit structure that includes substrate layers L1 through L10, and circuits formed thereon that need to be isolated from each other. By way of illustrative example, a noisy circuit including a spark gap 51 is implemented in the top portion of the multilayer circuit structure, and a further circuit is implemented in the lower portion of the multilayer circuit structure. The layers L5, L6 provide the isolation between the two circuits and are symmetrically disposed about the vertical symmetry plane S of the circuit structure. To illustrate signal and ground connections through the field control layers, conductive vias 63 interconnect a ground plane 65 formed on the layer L4 and a ground plane 67 formed on the layer L7, and conductive vias 69 provide for signal interconnection between the two circuits.

Figure 6A:
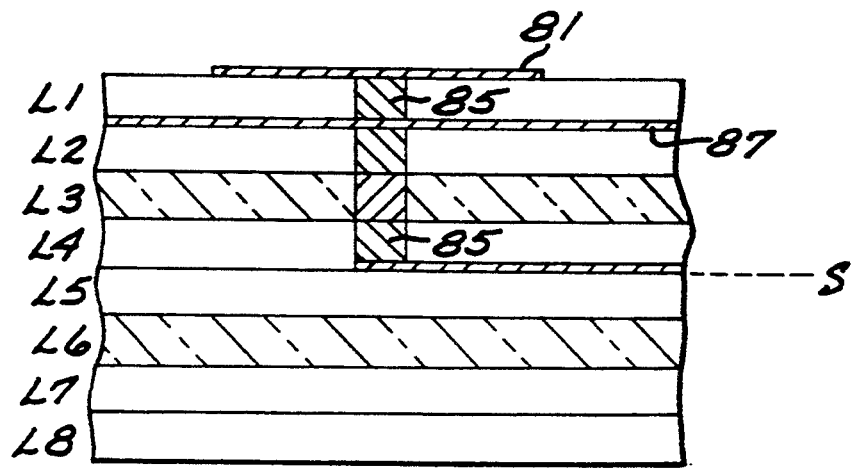
FIGS. 6A and 6B schematically depict a unitized multilayer circuit structure in accordance with the invention that illustrates isolation of a radiating circuit element by field control layers.
Figure 6B:
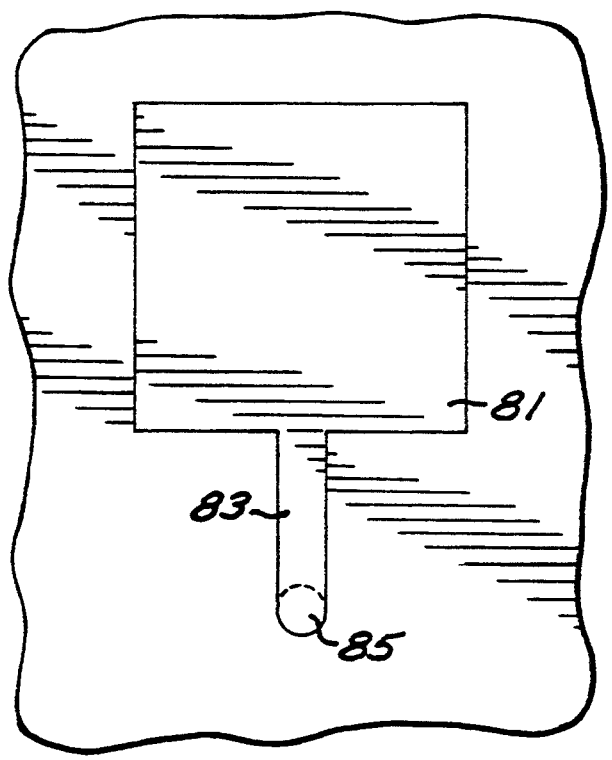

Referring now to FIGS. 6A and 6B, schematically illustrated therein is a multilayer circuit structure that includes substrate layers L1 through L8, and is configured to provide isolation between a radiator located on the outside of the circuit structure and associated circuitry integral to the multilayer circuit structure. A microstrip patch antenna 81, comprising for example a thick printed conductor area, is formed on the layer L1, and is connected to a feed line 83 which in turn is connected to a stack of controlled impedance vias 85 which extend through the layers L4 through L1. A reflector 87, which can also be a thick conductor area, is formed on the layer L2. The layer L3 is a high dielectric field control layer, and associated circuitry for the antenna can be implemented below the field control layer L3 on the layers L4 through L8. The layer L6 is also a high dielectric layer for symmetry about the vertical symmetry plane S.

Further in accordance with the invention, the dielectric field control layers can comprise low dielectric layers exclusively, or low dielectric layers intermixed with high dielectric layers.

Figure 7:
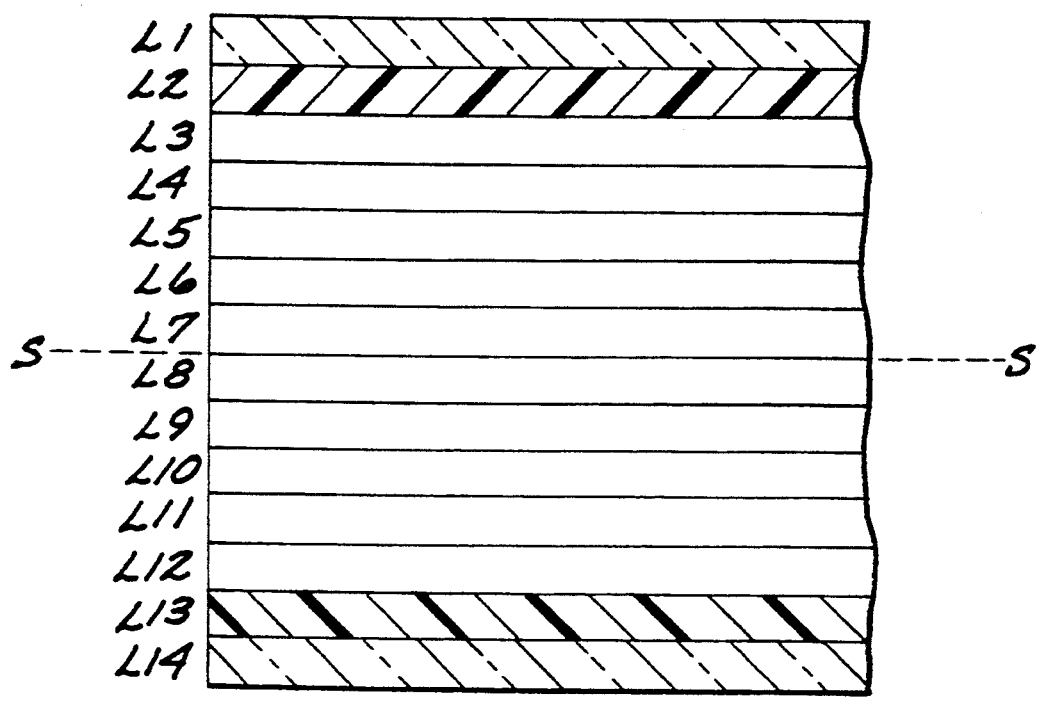
FIGS. 7 and 8 is a schematic elevational sectional view of a unitized multilayer circuit structure in accordance with the invention that includes high and low dielectric constant field layers.

Referring in particular to FIG. 7, schematically depicted therein is a unitized multilayer circuit structure in accordance with the invention that includes layers L1 through L14 wherein the layers L1, L14 comprise high dielectric constant field control layers on the top and bottom of the structure, the layers L2 and L13 comprise low dielectric constant field control layers, and the remaining layers comprise basic insulating layers. As a further implementation, the layers L2, L13 comprise high dielectric constant field control layers, the layers L1 and L14 comprise low dielectric constant field control layers, and the remaining layers comprise basic insulating layers.

Figure 8:
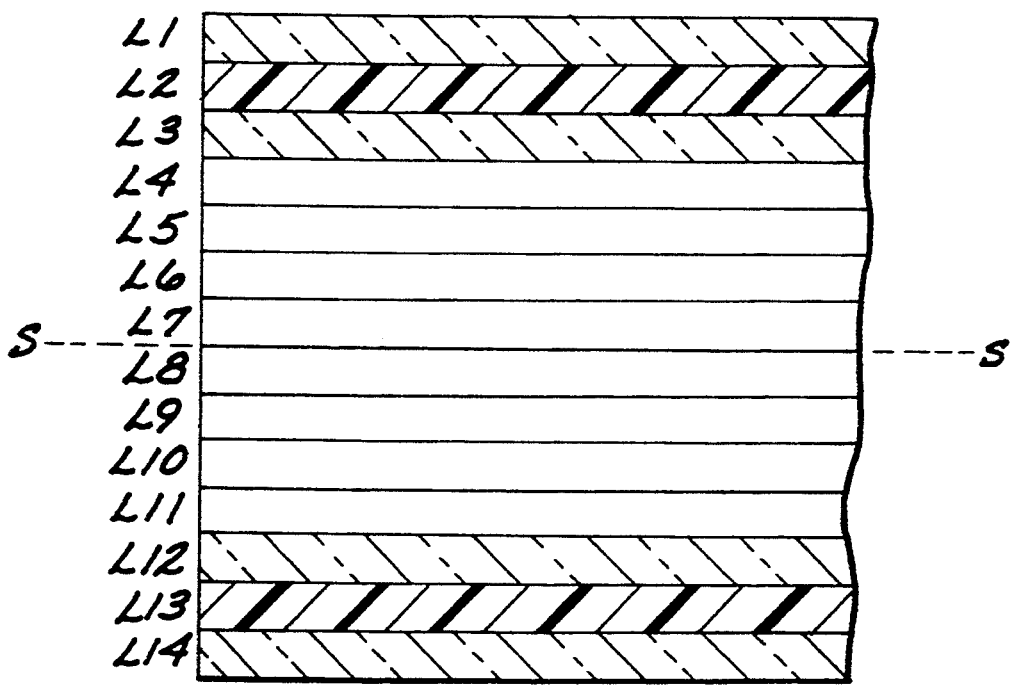

Referring now to FIG. 8, schematically depicted therein is a unitized multilayer circuit structure in accordance with the invention that includes layers L1 through L14 wherein the layers L1, L3, L12, and L14 comprise high dielectric constant field control layers the layers L2 and L13 comprise low dielectric constant field control layers, and the remaining layers comprise basic insulating layers.

A further example of a circuit structure that includes intermixed field control layers would be modifications to the structure of FIG. 4 wherein the layers L6 and L15 would comprise low dielectric layers, or the layers L7 and L14 would comprise low dielectric layers.

The high dielectric constant layers and the intermixed high and low dielectric constant layers in accordance with the invention can include cavity openings or via openings in the same manner as the insulating layers included in the multilayer circuit structure, wherein the cavity openings form sections of cavities in which discrete components can be placed pursuant to conventional designs, and wherein the via openings are filled with via fill material. It should be appreciated that openings in a high dielectric constant layer will result in some reduction in the effectiveness of the high dielectric constant layer. The high dielectric constant layers and the intermixed high and low dielectric constant layers in accordance with the invention can also be printed with passive components, conductive traces, and conductive shields in the same manner as the basic insulating layers included in the multilayer circuit structure.

Circuit structures in accordance with the invention can be implemented with different tapes of different materials that are compatible in the manufacturing process. This means that the different tapes must handle a common lamination process including common temperature, pressure, and time. They must also possess compatible sintering characteristics and rates which allow a common burnout and firing profile to be used since they comprise a single structure. The different tapes must also have compatible chemical compositions, not only with each other, but with all other materials used in the specific manufacturing process (e.g., LTCC, HTCC) including, for example, conductor and resistor inks. Finally, the different tapes must have compatible shrinkage during processing and compatible characteristics, including thermal expansion, as a completed product.

More particularly as to the shrinkage of the different tapes, it will generally be necessary to arrange the high dielectric constant layers in symmetrical form about the center of the substrate, since shrinkage rates during processing will differ to some extent for the high or dielectric constant tape layers and the basic ceramic tape layers. The difference in shrinkage rate will exert a force on the substrate that, if not counterbalanced, will distort the flat substrate into a shape that may resemble a potato chip. Symmetrical form is achieved, for example, by having an even number of high dielectric constant layers located symmetrically above and below the center of the substrate height or thickness, wherein the center of the height or thickness corresponds to the vertical symmetry plane as shown in FIGS. 2, 4, 6, 7. For the same shrinkage considerations, the symmetric layer pairs should be equal in thickness and formed of the same material.

Further for the same shrinkage considerations, low dielectric constant layers should also be located symmetrically above and below the center of the substrate height or thickness.

The foregoing has been a disclosure of a unitized multilayer circuit structure having basic insulating layers and dielectric field control layers having dielectric constants different from the dielectric constant of the basic insulating layers, wherein the incorporation of the dielectric field control layers can be achieved with conventional processes for forming unitized multilayer circuit structures. The dielectric field control layers control electric fields within the multilayer circuit structure, and further provide for circuit stability by providing a substantially uniform environment for the circuits within the substrate.

Although the foregoing has been a description and illustration of specific embodiments of the invention, various modifications and changes thereto can be made by persons skilled in the art without departing from the scope and spirit of the invention as defined by the following claims.

What is claimed is:
1. A multiple layer circuit structure comprising:
   a plurality of electrically insulating layers of a first dielectric constant arranged in a layered stack;
   a first high dielectric field control layer disposed on the top of said stack, said first high dielectric field control layer having a dielectric constant that is greater than said first dielectric constant and having a region without any parallel plate capacitors formed thereon;
   a second high dielectric field control layer disposed on the bottom of said stack, said second high dielectric field control layer, and having a dielectric constant that is greater said first dielectric constant and having a region without any parallel plate capacitors formed thereon.
2. The multiple layer circuit stricture of claim 1 wherein said electrically insulating layers, said first high dielectric field control layer, and said second high dielectric field control layer comprise cofired ceramic.
3. A multilayer circuit structure comprising:
   a plurality of electrically insulating layers of a first dielectric constant; and
   a plurality of low dielectric field control layers having a dielectric constant that is less than said first dielectric constant and respectively having respective regions without parallel plate capacitors formed thereon; and
   a plurality of high dielectric field control layers having a dielectric constant that is greater than said first dielectric constant and respectively having respective regions without parallel plate capacitors formed thereon;
   said low dielectric field control layers and said high dielectric field control layers being symmetrically intermixed with said electrically insulating layers and forming a layered stack therewith wherein said low dielectric field control layers are symmetrically located about a center of said layered stack and said high dielectric field control layers are symmetrically located about said center.
4. The multiple layer circuit structure of claim 3 wherein said electrically insulating layers, said low dielectric field control layers, and said high dielectric field control layers comprise co-fired ceramic.

* * * * *